United States Patent
Koo

(10) Patent No.: US 8,482,311 B2
(45) Date of Patent: *Jul. 9, 2013

(54) OUTPUT BUFFER CIRCUIT AND INTEGRATED CIRCUIT INCLUDING SAME

(75) Inventor: Kyung-Hoi Koo, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 101 days.

This patent is subject to a terminal disclaimer.

(21) Appl. No.: 13/179,613

(22) Filed: Jul. 11, 2011

(65) Prior Publication Data

US 2011/0267100 A1 Nov. 3, 2011

Related U.S. Application Data

(63) Continuation of application No. 12/694,565, filed on Jan. 27, 2010, now Pat. No. 7,990,175.

(30) Foreign Application Priority Data

Feb. 2, 2009 (KR) ........................ 10-2009-0007936

(51) Int. Cl.
  *H03K 19/003* (2006.01)

(52) U.S. Cl.
  USPC ............................................ 326/30; 326/26

(58) Field of Classification Search
  USPC .................................... 326/30, 21, 26, 31, 33
  See application file for complete search history.

(56) References Cited

U.S. PATENT DOCUMENTS

| | | |
|---|---|---|
| 5,311,083 A | 5/1994 | Wanlass |
| 6,026,456 A | 2/2000 | Ilkbahar |
| 6,051,989 A | 4/2000 | Walck |
| 6,424,170 B1 | 7/2002 | Raman et al. |
| 6,937,055 B2 | 8/2005 | Roy et al. |
| 7,205,787 B1 * | 4/2007 | Massoumi et al. .............. 326/30 |
| 7,375,545 B2 * | 5/2008 | Kubo .............................. 326/30 |
| 7,834,654 B2 | 11/2010 | Millar |

FOREIGN PATENT DOCUMENTS

| | | |
|---|---|---|
| JP | 08335871 A | 12/1996 |
| JP | 11055106 A | 2/1999 |

* cited by examiner

*Primary Examiner* — James H Cho
(74) *Attorney, Agent, or Firm* — Volentine & Whitt, PLLC

(57) ABSTRACT

An output buffer circuit includes a control unit and an output driver. The control unit generates a control signal in response to a mode signal applied from an internal circuit. The output driver selectively performs a driver operation, a termination operation or an electrostatic discharge (ESD) protection operation in response to the control signal.

21 Claims, 10 Drawing Sheets

OUTPUT BUFFER CIRCUIT AND INTEGRATED CIRCUIT INCLUDING SAME

CROSS-REFERENCE TO RELATED APPLICATION(S)

This application is a Continuation application of application Ser. No. 12/694,565, filed Jan. 27, 2010, which issued as U.S. Pat. No. 7,990,175, on Aug. 2, 2011, and which claims priority under 35 USC §119 to Korean Patent Application No. 2009-0007936 filed on Feb. 2, 2009, the subject matter of which are hereby incorporated by reference.

BACKGROUND

The present inventive concept relates generally to semiconductor devices, and more particularly to an output buffer circuit and an integrated circuit including same.

In general, receiver or transmitter circuitry incorporated within a semiconductor device is coupled to a termination resistor that has substantially the same impedance as a transmission channel. That is, the termination resistor is matched to the characteristic impedance of the transmission channel. A correctly matched termination resistor prevents a signal transmitted via the transmission channel from being reflected back as a noise signal. In contemporary semiconductor devices, on-chip termination resistors are commonly disposed within the semiconductor device.

On-chip termination resistors may be used to efficiently reduce reflected signals. However, as conventionally implemented, on-chip termination resistors tend to increase the overall size of the semiconductor device. Further, complicated calibration circuits are required to adjust the impedance of the on-chip termination resistor.

SUMMARY

Embodiments of the inventive concept provide an output buffer circuit having multiple functions and characterized by a relatively small size. Embodiments also provide an integrated circuit incorporating this type of output buffer circuit.

According to some embodiments, an output buffer circuit includes a control unit and an output driver.

The control unit generates a control signal in response to a mode signal applied from an internal circuit. The output driver selectively performs a driver operation, a termination operation or an electrostatic discharge (ESD) protection operation in response to the control signal.

In some embodiments, the control signal may include a switching signal and an operation selection signal, and the output driver may include a switching unit configured to selectively output data provided from the internal circuit or the operation selection signal in response to the switching signal, and a unit circuit coupled to the switching unit, the unit circuit configured to perform the driver operation when the switching unit outputs the data, and to selectively perform the termination operation or the ESD protection operation in response to the operation selection signal when the switching unit outputs the operation selection signal.

In some embodiments, the unit circuit may include a first resistor coupled to an input/output node, a PMOS transistor having a first source coupled to a first power supply voltage, a first gate coupled to the switching unit, and a first drain coupled to the first resistor, a second resistor coupled to the input/output node, and an NMOS transistor having a second source coupled to a second power supply voltage, a second gate coupled to the switching unit, and a second drain coupled to the second resistor.

In some embodiments, when the mode signal indicates a data output mode, the control unit may activate the switching signal and the switching unit may output the data to the first gate and the second gate in response to the activated switching signal.

In some embodiments, when the mode signal indicates a data input mode, the control unit may deactivate the switching signal and the switching unit may output the operation selection signal to the first gate and the second gate in response to the deactivated switching signal.

In some embodiments, the operation selection signal may include a first operation selection signal applied to the first gate and a second operation selection signal applied to the second gate, and the unit circuit may perform a center termination operation when the first operation signal has a logically low level and the second operation signal has a logically high level. The unit circuit may perform a pull-up termination operation when the first operation signal has a logically low level and the second operation signal has the logically low level. The unit circuit may perform a pull-down termination operation when the first operation signal has a logically high level and the second operation signal has the logically high level. The unit circuit may perform the ESD protection operation when the first operation signal has a logically high level and the second operation signal has a logically low level.

In some embodiments, the output buffer circuit may further include a calibration unit coupled to an external resistor, the calibration unit configured to adjust an impedance of the unit circuit based on an impedance of the external resistor.

In some embodiments, the control signal may include a plurality of switching signals and a plurality of operation selection signals, and the output driver may include a switching unit configured to selectively output data provided from the internal circuit or the operation selection signals in response to the switching signals, and a plurality of unit circuits coupled to the switching unit, the unit circuits connected to each other in parallel, the unit circuits configured to selectively perform the driver operation, the termination operation or the ESD protection operation in response to outputs of the switching unit.

In some embodiments, an impedance of the output driver may be adjusted through a number of unit circuits performing the driver operation or the termination operation. The impedance of the output driver may decrease as the number of unit circuits performing the driver operation or the termination operation increases.

In some embodiments, at least one of the unit circuits may perform the driver operation and the other unit circuits may perform the ESD protection operation when the output driver performs the driver operation.

In some embodiments, at least one of the unit circuits may perform the termination operation and the other unit circuits may perform the ESD protection operation when the output driver performs the termination operation.

In some embodiments, the unit circuits may be grouped into at least two groups, and the unit circuits in the same group may perform the same operation.

In some embodiments, the switching unit may include a plurality of multiplexers configured to receive the data and the operation selection signals as input signals, and to receive the switching signals as selection signals.

In some embodiments, the switching unit may further include an inverter configured to invert the data to generate inverted data, and to provide the inverted data to the multiplexers.

According to some embodiments, an integrated circuit includes an internal circuit and an output buffer circuit.

The internal circuit generates a mode signal representing a data output mode or a data input mode. The output buffer circuit generates a control signal in response to the mode signal, and selectively performs a driver operation, a termination operation or an electrostatic discharge (ESD) protection operation in response to the control signal.

In some embodiments, the integrated circuit may further include an input/output pad coupled to an input/output node, and an input buffer circuit coupled to the input/output node, the input buffer circuit receiving first data through the input/output pad, the internal circuit may process the first data received from the input buffer circuit, and generate second data, and the output buffer circuit may be coupled to the input/output node, and may output the second data through the input/output pad when the output buffer circuit performs the driver operation.

According to some embodiments, an output buffer circuit and an integrated circuit may have a driver function, a termination function and/or an electrostatic discharge protection function with small size. Further, according to some embodiments, an output buffer circuit and an integrated circuit may have various impedances by adjusting the impedance using parallel-connected unit circuits. Further, according to some embodiments, an output buffer circuit and an integrated circuit may be readily applied to various interfaces of a semiconductor device.

BRIEF DESCRIPTION OF THE DRAWINGS

Illustrative, non-limiting embodiments will be more clearly understood from the following detailed description taken in conjunction with the accompanying drawings.

DETAILED DESCRIPTION OF THE EMBODIMENTS

Various embodiments of the inventive concept will now be described in some additional detail with reference to the accompanying drawings. The present inventive concept may, however, be embodied in many different forms and should not be construed as being limited to only the embodiments set forth herein. Rather, these embodiments are presented as teaching examples. Throughout the drawings and written description, like numbers and labels refer to like or similar elements.

It will be understood that, although the terms first, second, third etc. may be used herein to describe various elements, these elements should not be limited by these terms. These terms are used to distinguish one element from another. Thus, a first element discussed below could be termed a second element without departing from the teachings of the present inventive concept. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1:
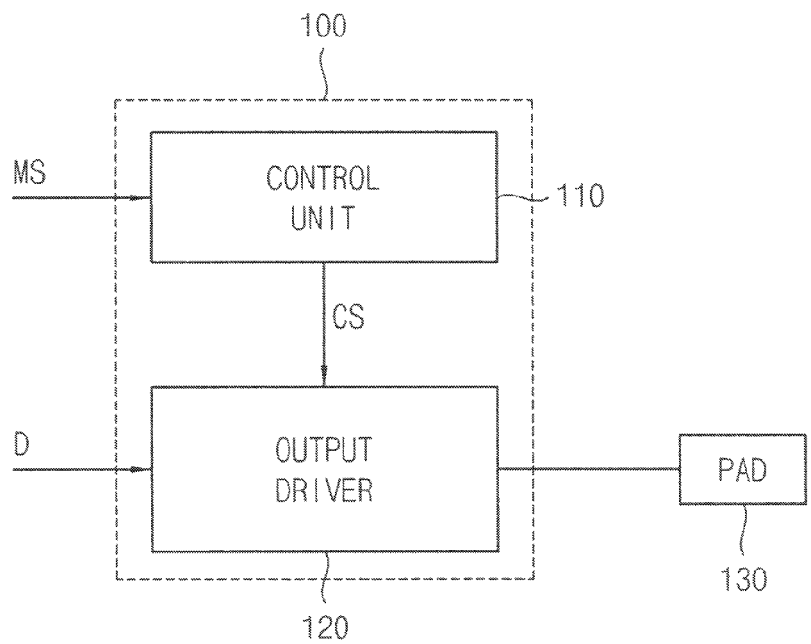
FIG. 1 is a block diagram illustrating an output buffer circuit according to some embodiments.

FIG. 1 is a block diagram illustrating an output buffer circuit according to some embodiments.

Referring to FIG. 1, an output buffer circuit 100 comprises a control unit 110 and an output driver 120. The output buffer circuit 100 is coupled to an input/output pad 130.

The control unit 110 generates a control signal CS in response to a mode signal MS. The control signal may include a switching signal and an operation selection signal. In some embodiments, the mode signal MS may be provided from an internal circuit of an integrated circuit where the output buffer circuit 100 is located. The mode signal MS may represent an operation mode of the integrated circuit. For example, the mode signal MS may represent a data output mode or a data input mode.

In some embodiments, the control unit 110 may include a register for storing control information about controlling the output driver 120 depending on the operation mode, and a control signal generating unit for generating the control signal CS based on the stored control information. The control information may include impedance information, termination type information, etc. For example, if the control signal generating unit receives the mode signal MS that indicates the data output mode, the control signal generating unit may read driver impedance information from the register, and may provide the output driver 120 with the control signal CS corresponding to the driver impedance information. If the control signal generating unit receives the mode signal MS that indicates the data input mode, the control signal generating unit may read the termination type information and termination impedance information from the register, and may provide the output driver 120 with the control signal CS corresponding to the termination type information and the termination impedance information.

The output driver 120 receives the control signal CS from the control unit 110, and selectively performs a driver operation, a termination operation or an electrostatic discharge (ESD) protection operation in response to the control signal CS. For example, during the data output mode, the output driver 120 may perform the driver operation such that the output driver 120 outputs data D provided from the internal circuit. During the data input mode, the output driver 120 may perform the driver operation such that the output driver 120 has impedance corresponding to characteristic impedance of a transmission channel (not shown) coupled to the input/output pad 130. Alternatively, during the data input mode, the output driver 120 may perform the ESD protection operation such that the output driver 120 protects the internal circuit from ESD event.

In some embodiments, the output buffer circuit 100 may be employed in various memory devices or various memory controllers. The operation of the output driver 120 during the data input mode may be determined according to the memory devices.

For example, the output buffer circuit 100 may be employed in a low power double data rate (LPDDR) memory device, LPDDR2 memory device, a mobile double data rate (mDDR) memory device or a controller for controlling the LPDDR memory device, the LPDDR2 memory device or the mDDR memory device. In this case, the output driver 120 may perform the ESD protection operation during the data input mode.

The output buffer circuit 100 may be employed in a double data rate (DDR) memory device, DDR2 memory device, DDR3 memory device or a controller for controlling the DDR memory device, the DDR2 memory device or the DDR3 memory device. In this case, the output driver 120 may perform a center termination operation during the data input mode.

The output buffer circuit 100 may be employed in a graphics double data rate 3 (GDDR3) memory device or a controller for controlling the GDDR3. In this case, the output driver 120 may perform a pull-up termination operation during the data input mode.

As described above, the output buffer circuit 100 may have a driver function, a termination function and/or an ESD protection function since the output driver 120 selectively performs the driver operation, the termination operation or the ESD protection operation. Further, the output buffer circuit 100 may be readily applied to various memory interfaces.

Figure 2:
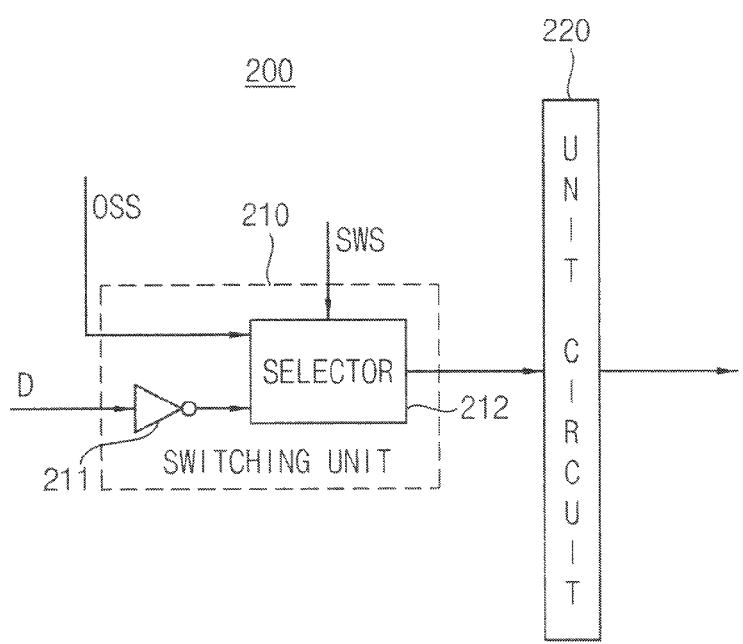
FIG. 2 is a block diagram illustrating an output driver included in the output buffer circuit of FIG. 1.

FIG. 2 is a block diagram illustrating an output driver included in the output buffer circuit of FIG. 1.

Referring to FIG. 2, an output drier 200 comprises a switching unit 210 and a unit circuit 220. The switching unit 210 receives a switching signal SWS and an operation selection signal OSS from the control unit 110 illustrated in FIG. 1. The switching unit 210 receives data D from an internal circuit. The switching unit 210 may selectively output the data D or the operation selection signal OSS in response to the switching signal SWS. For example, the switching unit 210 may output the data D when the switching signal SWS is activated to a first logically level, and may output the operation selection signal OSS when the switching signal SWS is deactivated to a second logically level. In some embodiments, the switching unit 210 may invert the data D and output the inverted data.

The switching unit 210 may include an inverter 211 and a selector 212. The inverter 211 receives the data D from the internal circuit, and may invert the data D. The selector 212 may have a first input terminal where the operation selection signal OSS is applied and a second input terminal where the inverted data is applied. The selector 212 may selectively output the operation selection signal OSS or the inverted data in response to the switching signal SWS. In some embodiments, the selector 212 may include a multiplexer that receives the switching signal SWS as a selection signal.

The unit circuit 220 is coupled to the switching unit 210. The unit circuit 220 may selectively perform a driver operation, a termination operation or an ESD protection operation in response to an output of the switching unit 210. For example, when the switching unit 210 outputs the inverted data, the unit circuit 220 may perform the driver operation such that the unit circuit 220 may invert again the inverted data to output the data D of a predetermined level. When the switching unit 210 outputs the operation selection signal OSS, the unit circuit 220 may selectively perform the termination operation or the ESD protection operation in response to the operation selection signal OSS. In this case, the operation of the unit circuit 220 may be determined based on a logically level of the operation selection signal OSS. In some embodiments, the switching unit 210 outputs a plurality of operation selection signals OSS, and the operation of the unit circuit 220 may be determined based on logically levels of the operation selection signals OSS.

FIGS. 3A through 4E are circuit diagrams for illustrating operations of the unit circuit 220 illustrated in FIG. 2.

Figure 3A:
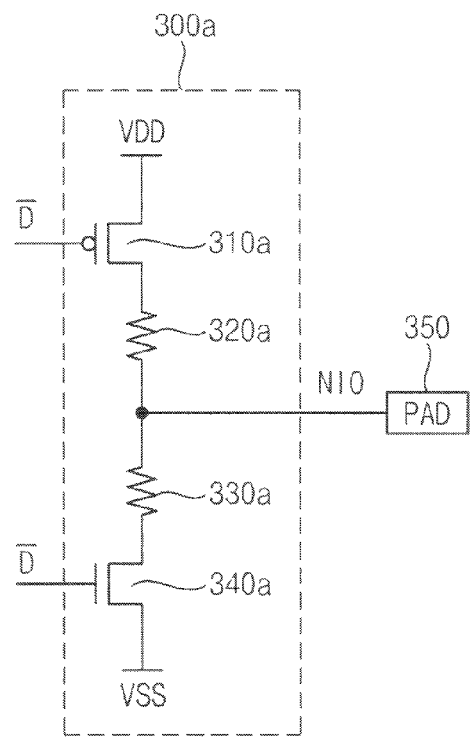
FIG. 3A is a circuit diagram illustrating a unit circuit included in the output driver of FIG. 2 when the unit circuit performs a driver operation.

FIG. 3A is a circuit diagram illustrating a unit circuit included in the output driver of FIG. 2 when the unit circuit performs a driver operation.

Referring to FIG. 3A, a unit circuit 300a performing the driver operation includes a PMOS transistor 310a, a first resistor 320a, a second resistor 330a and an NMOS transistor 340a.

The first resistor 320a and the second resistor 330a are coupled to an input/output node NIO. When the unit circuit 300a performs the driver operation, the first resistor 320a and the second resistor 330a are set to have predetermined driver impedance. In some embodiments, the first resistor 320a and the second resistor 330a may have substantially the same impedance.

The PMOS transistor 310a may have a first source coupled to a first power supply voltage VDD, a first gate coupled to the switching unit 210 illustrated in FIG. 2 and a first drain coupled to the first resistor 320a, and the NMOS transistor 340a may have a second source coupled to a second power supply voltage VSS, a second gate coupled to the switching unit 210 illustrated in FIG. 2 and a second drain coupled to the second resistor 330a.

If the switching unit 210 outputs inverted data /D, the unit circuit 300a performs the driver operation. For example, the first gate of the PMOS transistor 310a and the second gate of the NMOS transistor 340a receive the inverted data /D. The PMOS transistor 310a or the NMOS transistor 340a is selectively turned ON according to a logically level of the inverted data /D. For example, if the inverted data /D has a logically low level, the PMOS transistor 310a is turned ON and a voltage at the input/output node NIO has a logically high level. If the inverted data /D has a logically high level, the NMOS transistor 340a is turned ON and the voltage at the input/output node NIO has a logically low level. Accordingly, the unit circuit 300a may output data of a predetermined level through an input/output pad 350 to an external device, such as a memory device, a memory controller, etc.

Figure 3B:
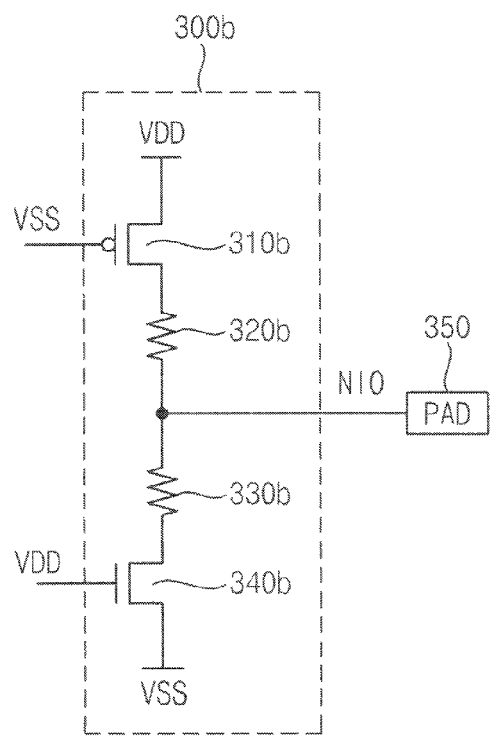
FIG. 3B is a circuit diagram illustrating a unit circuit included in the output driver of FIG. 2 when the unit circuit performs a center termination operation.

FIG. 3B is a circuit diagram illustrating a unit circuit included in the output driver of FIG. 2 when the unit circuit performs a center termination operation.

Referring to FIG. 3B, a unit circuit 300b performing the center termination operation includes a PMOS transistor 310b, a first resistor 320b, a second resistor 330b and an NMOS transistor 340b.

The first resistor 320b and the second resistor 330b are coupled to an input/output node NIO. When the unit circuit 300b performs the center termination operation, the first resistor 320b and the second resistor 330b are set to have predetermined termination impedance. Thus, by the first resistor 320b and the second resistor 330b, the unit circuit 300b may have impedance corresponding to characteristic impedance of a transmission channel coupled to an input/output pad 350. In some embodiments, the first resistor 320b and the second resistor 330b may have substantially the same impedance.

The PMOS transistor 310b may have a first source coupled to a first power supply voltage VDD, a first gate coupled to the switching unit 210 illustrated in FIG. 2 and a first drain coupled to the first resistor 320b, and the NMOS transistor 340b may have a second source coupled to a second power supply voltage VSS, a second gate coupled to the switching unit 210 illustrated in FIG. 2 and a second drain coupled to the second resistor 330b. Since the unit circuit 300b is provided with the first power supply voltage VDD and the second power supply voltage VSS, the unit circuit 300b may not require a termination voltage that has a middle voltage level between the first power supply voltage VDD and the second power supply voltage VSS.

If the switching unit 210 outputs a first operation selection signal having a logically low level and a second operation selection signal having a logically high level, the unit circuit 300b performs the center termination operation. For example, the switching unit 210 illustrated in FIG. 2 may output the second power supply voltage VSS as the first operation selection signal and the first power supply voltage VDD as the second operation selection signal. The first gate of the PMOS transistor 310b receives the second power supply voltage VSS as the first operation selection signal, and the second gate of the NMOS transistor 340b receives the first power supply voltage VDD as the second operation selection signal. Both the PMOS transistor 310b and the NMOS transistor 340b are turned ON. Accordingly, the unit circuit 300b may perform the center termination operation such that signals transmitted through the transmission channel are prevented from being reflected.

Figure 3C:
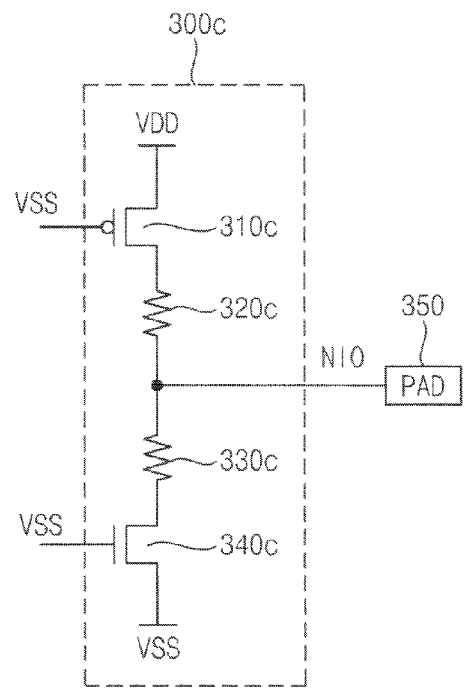
FIG. 3C is a circuit diagram illustrating a unit circuit included in the output driver of FIG. 2 when the unit circuit performs a pull-up termination operation.

FIG. 3C is a circuit diagram illustrating a unit circuit included in the output driver of FIG. 2 when the unit circuit performs a pull-up termination operation.

Referring to FIG. 3C, a unit circuit 300c performing the pull-up termination operation includes a PMOS transistor 310c, a first resistor 320c, a second resistor 330c and an NMOS transistor 340c.

The first resistor 320c and the second resistor 330c are coupled to an input/output node NIO. When the unit circuit 300c performs the pull-up termination operation, the first resistor 320c is set to have predetermined termination impedance. Thus, by means of the first resistor 320c, the unit circuit 300c may have impedance corresponding to characteristic impedance of a transmission channel coupled to an input/output pad 350.

The PMOS transistor 310c may have a first source coupled to a first power supply voltage VDD, a first gate coupled to the switching unit 210 illustrated in FIG. 2 and a first drain coupled to the first resistor 320c, and the NMOS transistor 340c may have a second source coupled to a second power supply voltage VSS, a second gate coupled to the switching unit 210 illustrated in FIG. 2 and a second drain coupled to the second resistor 330c.

If the switching unit 210 outputs a first operation selection signal having a logically low level and a second operation selection signal having a logically low level, the unit circuit 300c performs the pull-up termination operation. For example, the switching unit 210 illustrated in FIG. 2 may output the second power supply voltage VSS as the first operation selection signal and the second power supply voltage VSS as the second operation selection signal. The first gate of the PMOS transistor 310c receives the second power supply voltage VSS as the first operation selection signal, and the second gate of the NMOS transistor 340c receives the second power supply voltage VSS as the second operation selection signal. The PMOS transistor 310c may be turned ON and the NMOS transistor 340c may be turned OFF. Accordingly, the unit circuit 300c may perform the pull-up termination operation such that signals transmitted through the transmission channel are prevented from being reflected and a voltage at the input/output node NIO is pulled up to the logically high level.

Figure 3D:
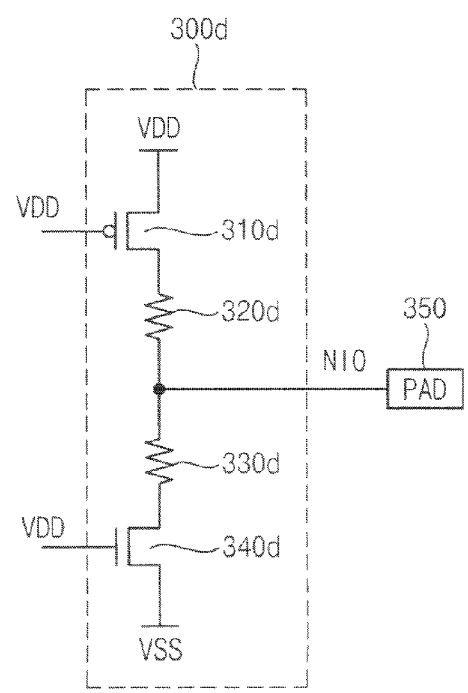
FIG. 3D is a circuit diagram illustrating a unit circuit included in the output driver of FIG. 2 when the unit circuit performs a pull-down termination operation.

FIG. 3D is a circuit diagram illustrating a unit circuit included in the output driver of FIG. 2 when the unit circuit performs a pull-down termination operation.

Referring to FIG. 3D, a unit circuit 300d performing the pull-down termination operation includes a PMOS transistor 310d, a first resistor 320d, a second resistor 330d and an NMOS transistor 340d.

The first resistor 320d and the second resistor 330d are coupled to an input/output node NIO. When the unit circuit 300d performs the pull-down termination operation, the second resistor 330d is set to have predetermined termination impedance. Thus, by the second resistor 330d, the unit circuit 300d may have impedance corresponding to characteristic impedance of a transmission channel coupled to an input/output pad 350.

The PMOS transistor 310d may have a first source coupled to a first power supply voltage VDD, a first gate coupled to the switching unit 210 illustrated in FIG. 2 and a first drain coupled to the first resistor 320d, and the NMOS transistor 340d may have a second source coupled to a second power supply voltage VSS, a second gate coupled to the switching unit 210 illustrated in FIG. 2 and a second drain coupled to the second resistor 330d.

If the switching unit 210 outputs a first operation selection signal having a logically high level and a second operation selection signal having a logically high level, the unit circuit 300d performs the pull-down termination operation. For example, the switching unit 210 illustrated in FIG. 2 may output the first power supply voltage VDD as the first operation selection signal and the first power supply voltage VDD as the second operation selection signal. The first gate of the PMOS transistor 310d receives the first power supply voltage VDD as the first operation selection signal, and the second gate of the NMOS transistor 340d receives the first power supply voltage VDD as the second operation selection signal. The PMOS transistor 310d may be turned OFF and the NMOS transistor 340d may be turned ON. Accordingly, the unit circuit 300d may perform the pull-down termination operation such that signals transmitted through the transmission channel are prevented from being reflected and a voltage at the input/output node NIO is pulled down to the logically low level.

Figure 3E:
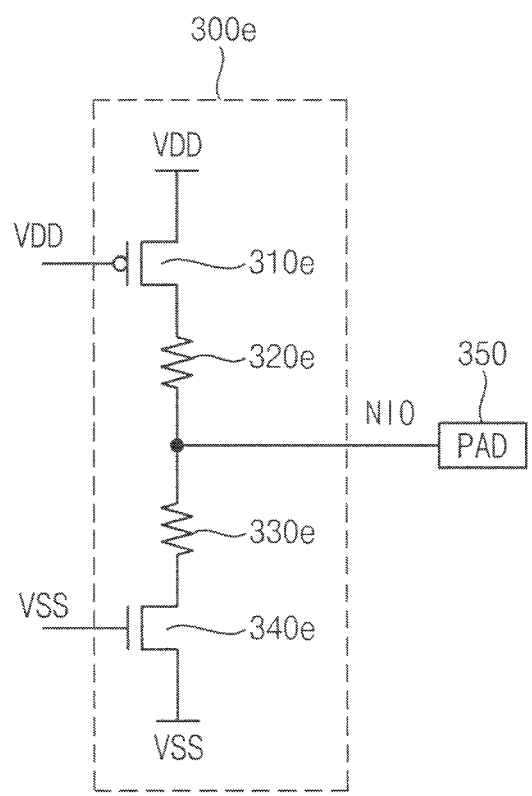
FIG. 3E is a circuit diagram illustrating a unit circuit included in the output driver of FIG. 2 when the unit circuit performs an electrostatic discharge (ESD) protection operation.

FIG. 3E is a circuit diagram illustrating a unit circuit included in the output driver of FIG. 2 when the unit circuit performs an electrostatic discharge (ESD) protection operation.

Referring to FIG. 3E, a unit circuit 300e performing the ESD protection operation includes a PMOS transistor 310e, a first resistor 320e, a second resistor 330e and an NMOS transistor 340e.

The first resistor 320e and the second resistor 330e are coupled to an input/output node NIO. The PMOS transistor 310e may have a first source coupled to a first power supply voltage VDD, a first gate coupled to the switching unit 210 illustrated in FIG. 2 and a first drain coupled to the first resistor 320e, and the NMOS transistor 340e may have a second source coupled to a second power supply voltage VSS, a second gate coupled to the switching unit 210 illustrated in FIG. 2 and a second drain coupled to the second resistor 330e.

If the switching unit 210 outputs a first operation selection signal having a logically high level and a second operation selection signal having a logically low level, the unit circuit 300e performs the ESD protection operation. For example, the switching unit 210 illustrated in FIG. 2 may output the first power supply voltage VDD as the first operation selection signal and the second power supply voltage VSS as the second operation selection signal. For example, the first gate of the PMOS transistor 310e may be coupled to the first power supply voltage VDD through the switching unit 210 illustrated in FIG. 2 and/or the control unit 100 illustrated in FIG. 1 and, and the second gate of the NMOS transistor 340e may be coupled to the second power supply voltage VSS through the switching unit 210 illustrated in FIG. 2 and/or the control unit 100 illustrated in FIG. 1. Both the PMOS transistor 310e and the NMOS transistor 340e may be turned OFF. When an ESD event occurs, the PMOS transistor 310e and/or NMOS transistor 340e may provide a path for discharging charges to protect an internal circuit from the ESD event.

As described above, the unit circuit 220, 300a, 300b, 300c, 300d and 300e may perform a driver operation, a termination operation and an ESD protection operation with small size.

Figure 4:
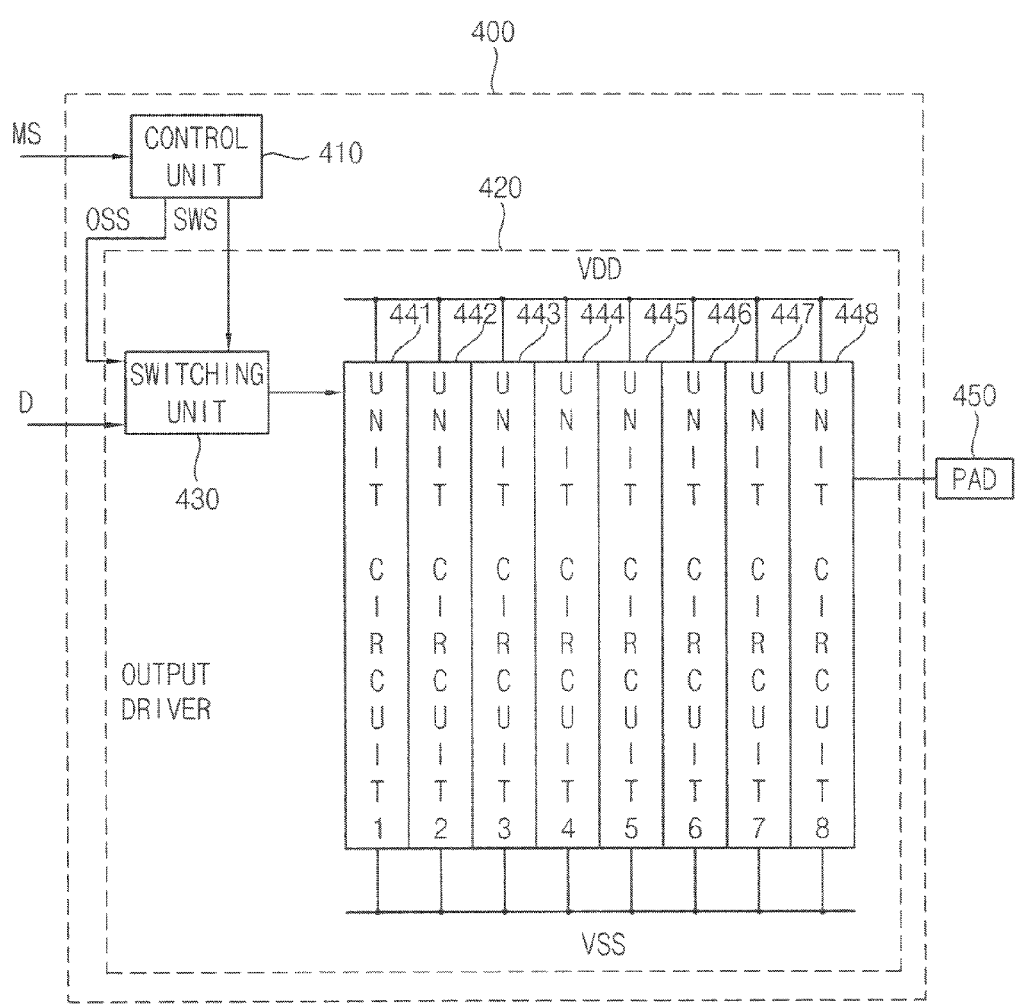
FIG. 4 is a block diagram illustrating an output buffer circuit according to some embodiments.

FIG. 4 is a block diagram illustrating an output buffer circuit according to some embodiments.

Referring to FIG. 4, an output buffer circuit 400 comprises a control unit 410 and an output driver 420. In the illustrated example of FIG. 4, the output buffer circuit 400 is coupled to an input/output pad 450.

The control unit 410 generates a control signal in response to a mode signal MS. The control signal may include a switching signal SWS and an operation selection signal OSS. In some embodiments, the mode signal MS may be provided from an internal circuit of an integrated circuit where the output buffer circuit 400 is located. The mode signal MS may represent a data output mode or a data input mode. In some embodiments, the control unit 410 may include a register for storing control information about controlling the output driver 420 depending on the operation mode, and a control signal generating unit for generating the control signal based on the stored control information.

The output driver 420 receives the control signal including the switching signal SWS and the operation selection signal OSS from the control unit 410, and selectively performs a driver operation, a termination operation or an electrostatic discharge (ESD) protection operation in response to the switching signal SWS and the operation selection signal OSS.

The output driver 420 includes a switching unit 430 and a plurality of unit circuits 441, 442, 443, 444, 445, 446, 447 and 448. The switching unit 430 receives the switching signal SWS and the operation selection signal OSS from the control unit 410, and receives data D from the internal circuit. The switching unit 430 may selectively output the data D or the operation selection signal OSS in response to the switching signal SWS.

Each unit circuit 441, 442, 443, 444, 445, 446, 447 and 448 is coupled to the switching unit 430, and is coupled to an input/output pad 450. The unit circuits 441, 442, 443, 444, 445, 446, 447 and 448 are connected in parallel between a first power supply voltage VDD and a second power supply voltage VSS. Each unit circuit 441, 442, 443, 444, 445, 446, 447 and 448 may selectively perform a driver operation, a termination operation or an ESD protection operation in response to outputs of the switching unit 430.

In some embodiments, when the output driver 420 performs the driver operation or the termination operation, impedance of the output driver 420 may be adjusted through the number of the unit circuits 441, 442, 443, 444, 445, 446, 447 and 448 performing the driver operation or the termination operation. For example, when the output driver 420 performs the driver operation, a predetermined number of unit circuits that have desired driver impedance may perform the driver operation. The other unit circuits may perform the ESD protection operation, which may not affect the impedance of the output driver 420. When the output driver 420 performs the termination operation, a predetermined number of unit circuits that have desired termination impedance may perform the termination operation, and the other unit circuits may perform the ESD protection operation. In some embodiments, the unit circuits 441, 442, 443, 444, 445, 446, 447 and 448 may include resistors of substantially the same impedance.

As described above, the output buffer circuit 400 may have a driver function, a termination function and an ESD protection function since the output driver 420 selectively performs the driver operation, the termination operation or the ESD protection operation. Further, the output buffer circuit 400 may provide various impedances by controlling operations of the unit circuits 441, 442, 443, 444, 445, 446, 447 and 448.

While the output buffer circuit 400 is illustrated in FIG. 4 as including eight unit circuits 441, 442, 443, 444, 445, 446, 447 and 448, the output buffer circuit 400 might alternately be configured with one or more unit circuits. In some embodiments, the output buffer circuit 400 may include $2^N$ unit circuits, where "N" is a natural number.

Figure 5:
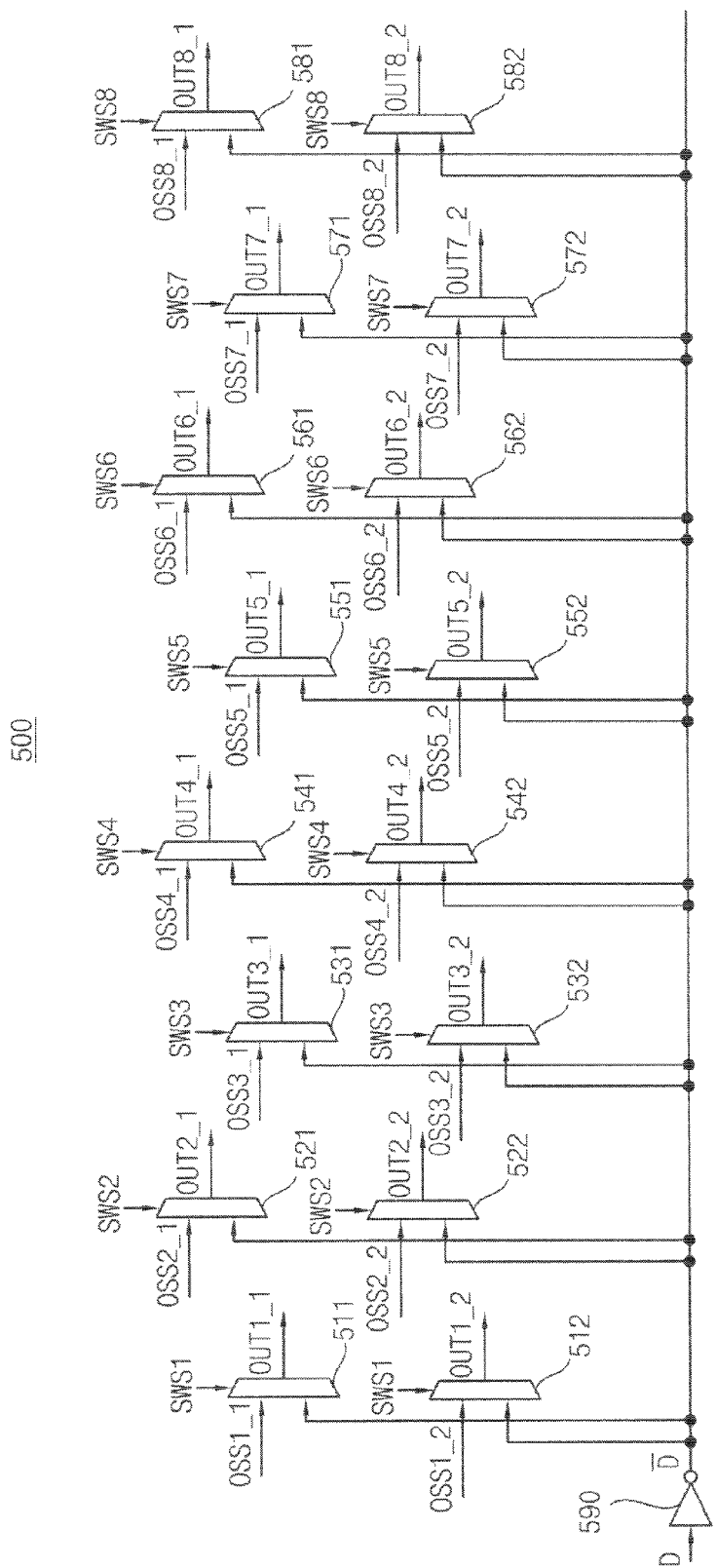
FIG. 5 is a block diagram illustrating a switching unit included in the output buffer circuit of FIG. 4.

FIG. 5 is a block diagram illustrating a switching unit included in the output buffer circuit of FIG. 4.

Referring to FIG. 5, a switching unit 500 comprises first through sixteenth selectors 511 through 582 and an inverter 590.

The inverter 590 receives data D from an internal circuit, and may output inverted data /D. The first selector 511 receives a first operation selection signal OSS1_1 and the inverted data /D as input signals, and receives a first switching signal SWS1 as a selection signal. The second selector 512 receives a second operation selection signal OSS1_2 and the inverted data /D as input signals, and receives the first switching signal SWS1 as a selection signal. The third selector 521 receives a third operation selection signal OSS2_1 and the inverted data /D as input signals, and receives a second switching signal SWS2 as a selection signal. The fourth selector 522 receives a fourth operation selection signal OSS2_2 and the inverted data /D as input signals, and receives the second switching signal SWS2 as a selection signal. The fifth selector 531 receives a fifth operation selection signal OSS3_1 and the inverted data /D as input signals, and receives a third switching signal SWS3 as a selection signal. The sixth selector 532 receives a sixth operation selection signal OSS3_2 and the inverted data /D as input signals, and receives the third switching signal SWS3 as a selection signal. The seventh selector 541 receives a seventh operation selection signal OSS4_1 and the inverted data /D as input signals, and receives a fourth switching signal SWS4 as a selection signal. The eighth selector 542 receives an eighth operation selection signal OSS4_2 and the inverted data /D as input signals, and receives the fourth switching signal SWS4 as a selection signal. The ninth selector 551 receives a ninth operation selection signal OSS5_1 and the inverted data /D as input signals, and receives a fifth switching signal SWS5 as a selection signal. The tenth selector 552 receives a tenth operation selection signal OSS5_2 and the inverted data /D as input signals, and receives the fifth switching signal SWS5 as a selection signal. The eleventh selector 561 receives an eleventh operation selection signal OSS6_1 and the inverted data /D as input signals, and receives a sixth switching signal SWS6 as a selection signal. The twelfth selector 562 receives a twelfth operation selection signal OSS6_2 and the inverted data /D as input signals, and receives the sixth switching signal SWS6 as a selection signal. The thirteenth selector 571 receives a thirteenth operation selection signal OSS7_1 and the inverted data /D as input signals, and receives a seventh switching signal SWS7 as a selection signal. The fourteenth selector 572 receives a fourteenth operation selection signal OSS7_2 and the inverted data /D as input signals, and receives the seventh switching signal SWS1 as a selection signal. The fifteenth selector 581 receives a fifteenth operation selection signal OSS8_1 and the inverted data /D as input signals, and receives an eighth switching signal SWS8 as a selection signal. The sixteenth selector 582 receives a sixteenth operation selection signal OSS8_2 and the inverted data /D as input signals, and receives the eighth switching signal SWS1 as a selection signal.

Figure 6A:
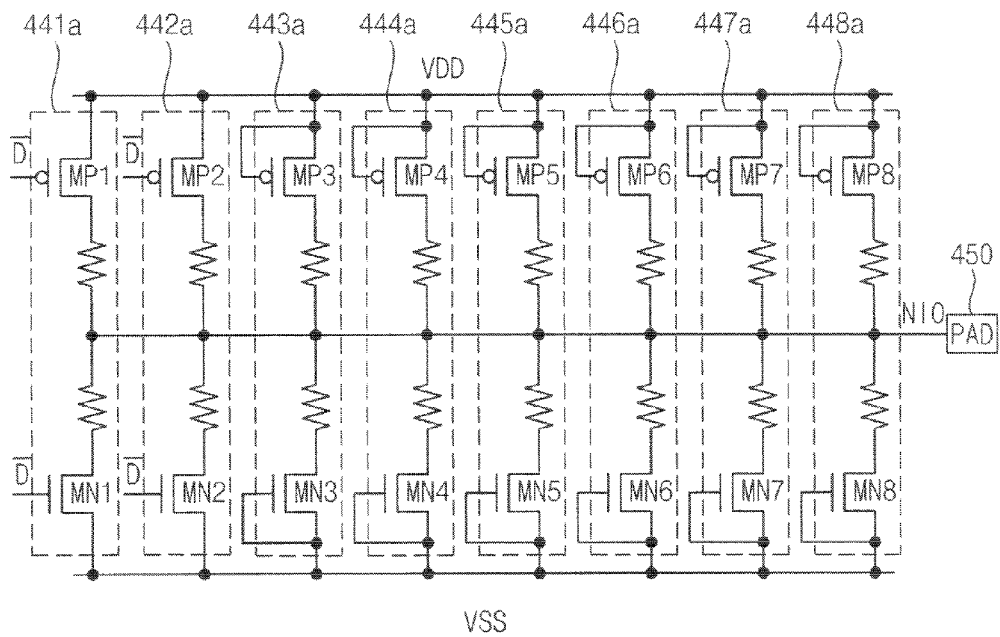
FIGS. 6A and 6B are circuit diagrams illustrating a plurality of unit circuits included in the output buffer circuit of FIG. 4 when the output buffer circuit performs a driver operation.
Figure 6B:
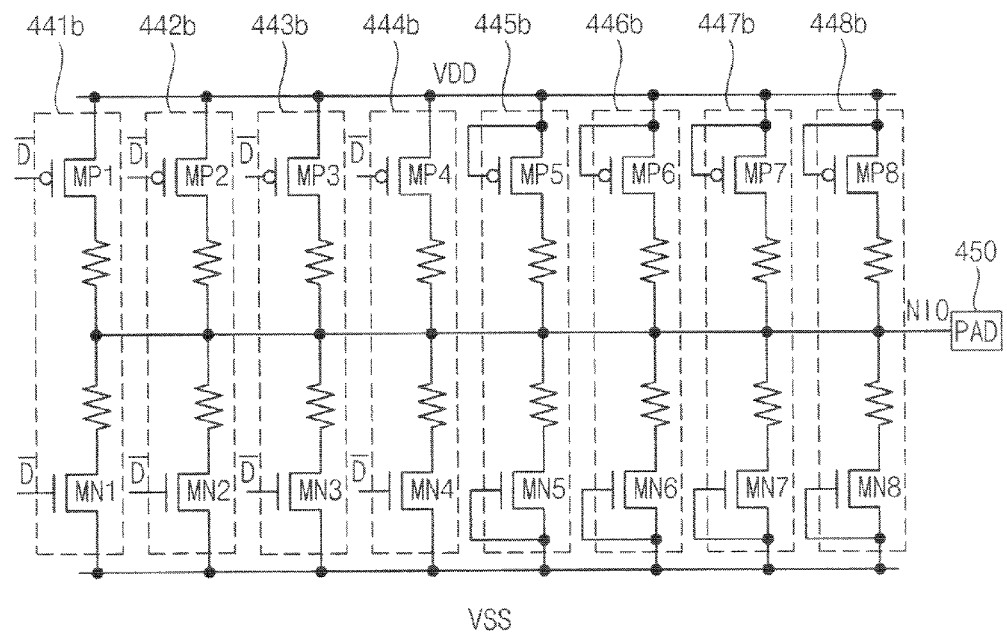
Figure 7A:
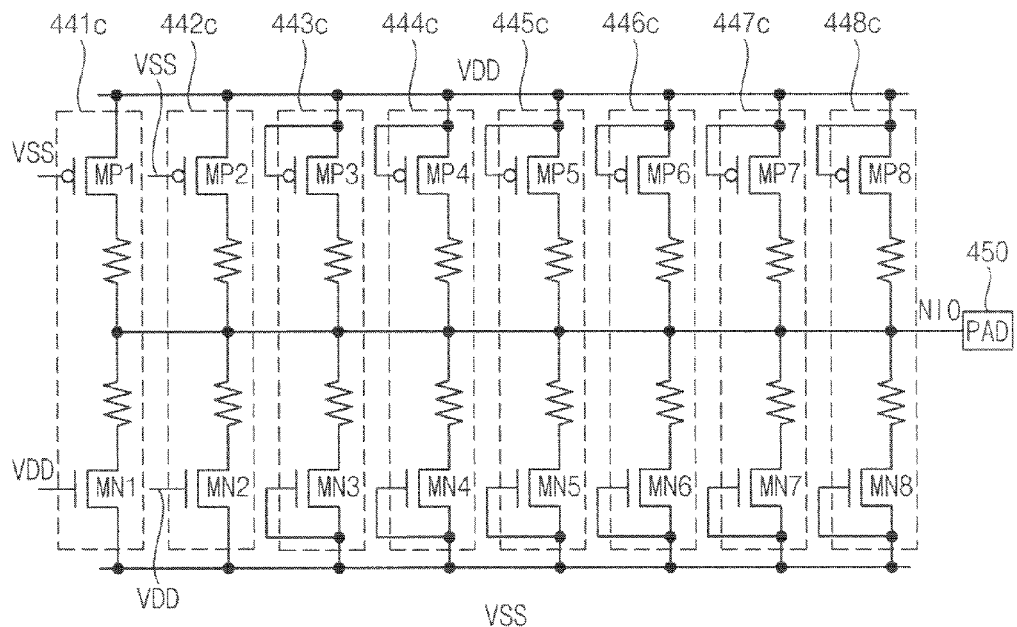
FIGS. 7A and 7B are circuit diagrams illustrating a plurality of unit circuits included in the output buffer circuit of FIG. 4 when the output buffer circuit performs a center termination operation.
Figure 7B:
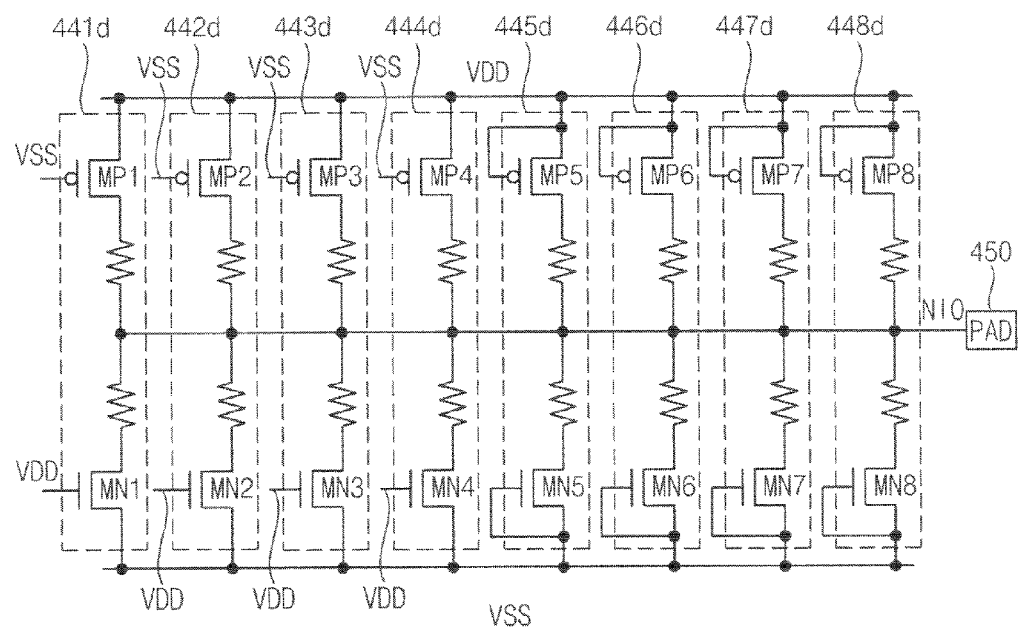

FIGS. 6A and 6B are circuit diagrams illustrating a plurality of unit circuits included in the output buffer circuit of FIG. 4 when the output buffer circuit performs a driver operation. FIGS. 7A and 7B are circuit diagrams illustrating a plurality of unit circuits included in the output buffer circuit of FIG. 4 when the output buffer circuit performs a center termination operation.

Referring to FIGS. 4 through 7B, an output signal OUT1_1 of the first selector 511 and an output signal OUT1_2 of the second selector 512 are applied to gates of a first PMOS transistor MP1 and a first NMOS transistor MN1 included in the first unit circuit 441. An output signal OUT2_1 of the third selector 521 and an output signal OUT2_2 of the fourth selector 522 are applied to gates of a second PMOS transistor MP2 and a second NMOS transistor MN2 included in the second unit circuit 442. An output signal OUT3_1 of the fifth selector 531 and an output signal OUT3_2 of the sixth selector 532 are applied to gates of a third PMOS transistor MP3 and a third NMOS transistor MN3 included in the third unit circuit 443. An output signal OUT4_1 of the seventh selector 541 and an output signal OUT4_2 of the eighth selector 542 are applied to gates of a fourth PMOS transistor MP4 and a fourth NMOS transistor MN4 included in the fourth unit circuit 444. An output signal OUT5_1 of the ninth selector 551 and an output signal OUT5_2 of the tenth selector 552 are applied to gates of a fifth PMOS transistor MP5 and a fifth NMOS transistor MN5 included in the fifth unit circuit 445. An output signal OUT6_1 of the eleventh selector 561 and an output signal OUT6_2 of the twelfth selector 562 are applied to gates of a sixth PMOS transistor MP6 and a sixth NMOS transistor MN6 included in the sixth unit circuit 446. An output signal OUT7_1 of the thirteenth selector 571 and an output signal OUT7_2 of the fourteenth selector 572 are applied to gates of a seventh PMOS transistor MP7 and a seventh NMOS transistor MN7 included in the seventh unit circuit 447. An output signal OUT8_1 of the fifteenth selector 581 and an output signal OUT8_2 of the sixteenth selector 582 are applied to gates of an eighth PMOS transistor MP8 and an eighth NMOS transistor MN8 included in the eighth unit circuit 448. Operation of the unit circuits 441 through 448 and impedance of the output driver 420 may be determined based on the output signals OUT1_1 through OUT8_2 of the first through sixteenth selectors 511 through 582.

In FIG. 6A, the inverted data /D is applied to gates of the first and second PMOS transistors MP1 and MP2 and gates of the first and second NMOS transistors MN1 and MN2, the first power supply voltage VDD is applied to gates of the third through eighth PMOS transistors MP3 through MP8, and the second power supply voltage VSS is applied to gates of the third through eighth NMOS transistors MN3 through MN8. The first and second unit circuits 441a and 442a perform the driver operation and the third though eighth unit circuits 443a through 448a perform the ESD protection operation. Since two parallel-connected unit circuits 441a and 442a perform the driver operation, the impedance of the output driver 420 may correspond to half impedance of one unit circuit.

In FIG. 6B, the inverted data /D is applied to gates of the first through fourth PMOS transistors MP1 through MP4 and gates of the first through fourth NMOS transistors MN1 through MN4, the first power supply voltage VDD is applied to gates of the fifth through eighth PMOS transistors MP5 through MP8, and the second power supply voltage VSS is applied to gates of the fifth through eighth NMOS transistors MN5 through MN8. The first through fourth unit circuits 441b through 444b perform the driver operation and the fifth though eighth unit circuits 445b through 448b perform the ESD protection operation. Since four parallel-connected unit circuits 441b through 444b perform the driver operation, the impedance of the output driver 420 may correspond to quarter impedance of one unit circuit.

In FIG. 7A, the second power supply voltage VSS is applied to gates of the first and second PMOS transistors MP1 and MP2 and gates of the third through eighth NMOS transistors MN3 through MN8, the first power supply voltage VDD is applied to gates of the first and second NMOS transistors MN1 and MN2 and gates of the third through eighth PMOS transistors MP3 through MP8. The first and second unit circuits 441c and 442c perform the center termination operation and the third though eighth unit circuits 443c through 448c perform the ESD protection operation. Since two parallel-connected unit circuits 441c and 442c perform the center termination operation, the impedance of the output driver 420 may correspond to half impedance of one unit circuit.

In FIG. 7B, the second power supply voltage VSS is applied to gates of the first through fourth PMOS transistors MP1 through MP4 and gates of the fifth through eighth NMOS transistors MN5 through MN8, the first power supply voltage VDD is applied to gates of the first through fourth NMOS transistors MN1 through MN4 and gates of the fifth through eighth PMOS transistors MP5 through MP8. The first through fourth unit circuits 441d through 444d perform the center termination operation and the fifth though eighth unit circuits 445d through 448d perform the ESD protection operation. Since four parallel-connected unit circuits 441d through 444d perform the center termination operation, the impedance of the output driver 420 may correspond to quarter impedance of one unit circuit.

As described above, the impedance of the output driver 420 may be adjusted through the number of the unit circuits 441, 442, 443, 444, 445, 446, 447 and 448 performing the driver operation or the termination operation. For example, if each unit circuit 441, 442, 443, 444, 445, 446, 447 and 448 has impedance of about 240Ω, one unit circuit performs the driver operation, and seven unit circuits perform the ESD protection operation, then the impedance of the output driver 420 may be about 240Ω. When two, three, four, five, six, seven or eight unit circuits perform the driver operation, the impedance of the output driver 420 may be about 120Ω, about 80Ω, about 60Ω, about 48Ω, about 40Ω, about 34Ω or about 30Ω, respectively. The output driver 420 may be controlled such that the impedance of the output driver 420 performing the termination operation is higher than when the output driver 420 performs the driver operation.

While two selectors are coupled to each unit circuit in FIGS. 5 through 7B, at least one unit circuit may be grouped and two selectors may be coupled to each group of unit circuits in some embodiments. The unit circuits in the same group may perform the same operation. For example, the first unit circuit 441 may be grouped into a first group, the second unit circuit 442 may be grouped into a second group, the third and fourth unit circuits 443 and 444 may be grouped into a third group, and the fifth through eighth unit circuits 445 through 448 may be grouped into a fourth group. The first group receives data from two selectors coupled to the first group and the third group receives the data from two selectors coupled to the third group so that three unit circuits 441, 443 and 444 may perform the driver operation.

Figure 8:
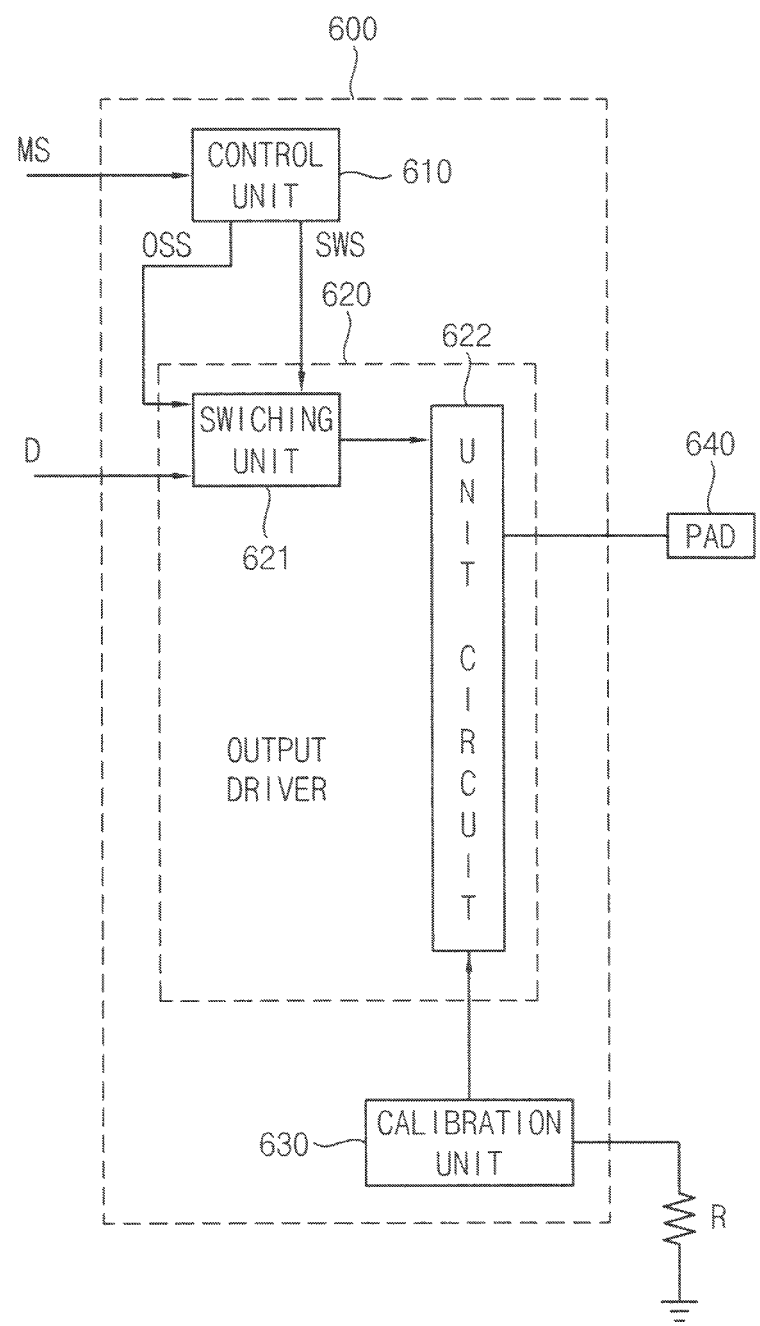
FIG. 8 is a block diagram illustrating an output buffer circuit according to some embodiments.

FIG. 8 is a block diagram illustrating an output buffer circuit according to some embodiments.

Referring to FIG. 8, an output buffer circuit 600 comprises a control unit 610, an output driver 620 and calibration unit 630. The output buffer circuit 600 is coupled to an input/output pad 640.

The control unit 610 generates a switching signal SWS and an operation selection signal OSS in response to a mode signal MS. The output driver 620 receives the switching signal SWS and the operation selection signal OSS from the control unit 610, and selectively performs a driver operation, a termination operation or an ESD protection operation in response to the switching signal SWS and the operation selection signal OSS.

The output driver 620 includes a switching unit 621 and a unit circuit 622. The switching unit 621 receives the switching signal SWS and the operation selection signal OSS from the control unit 610, and receives data D from an internal circuit. The switching unit 621 may selectively output the data D or the operation selection signal OSS in response to the switching signal SWS. The unit circuit 622 may selectively perform the driver operation, the termination operation or the ESD protection operation in response to an output of the switching unit 621.

The calibration unit 630 may adjust impedance of the unit circuit 622. The calibration unit 630 may be coupled an external resistor R, and may adjust the impedance of the unit circuit 622 using the external resistor R as a reference resistor. The calibration unit 630 may compensate for changes due to process, voltage or temperature (PVT) variation(s).

In some embodiments, the output buffer circuit 600 comprises a plurality of unit circuits, and the calibration unit 630 may adjust impedance of each unit circuit to compensate for the PVT variation. The overall impedance of the output driver 620 may be adjusted by controlling operations of the unit circuits. Thus, since one calibration unit is required to adjust a plurality of unit circuits, the calibration unit 630 may be easily implemented with small size.

Figure 9:
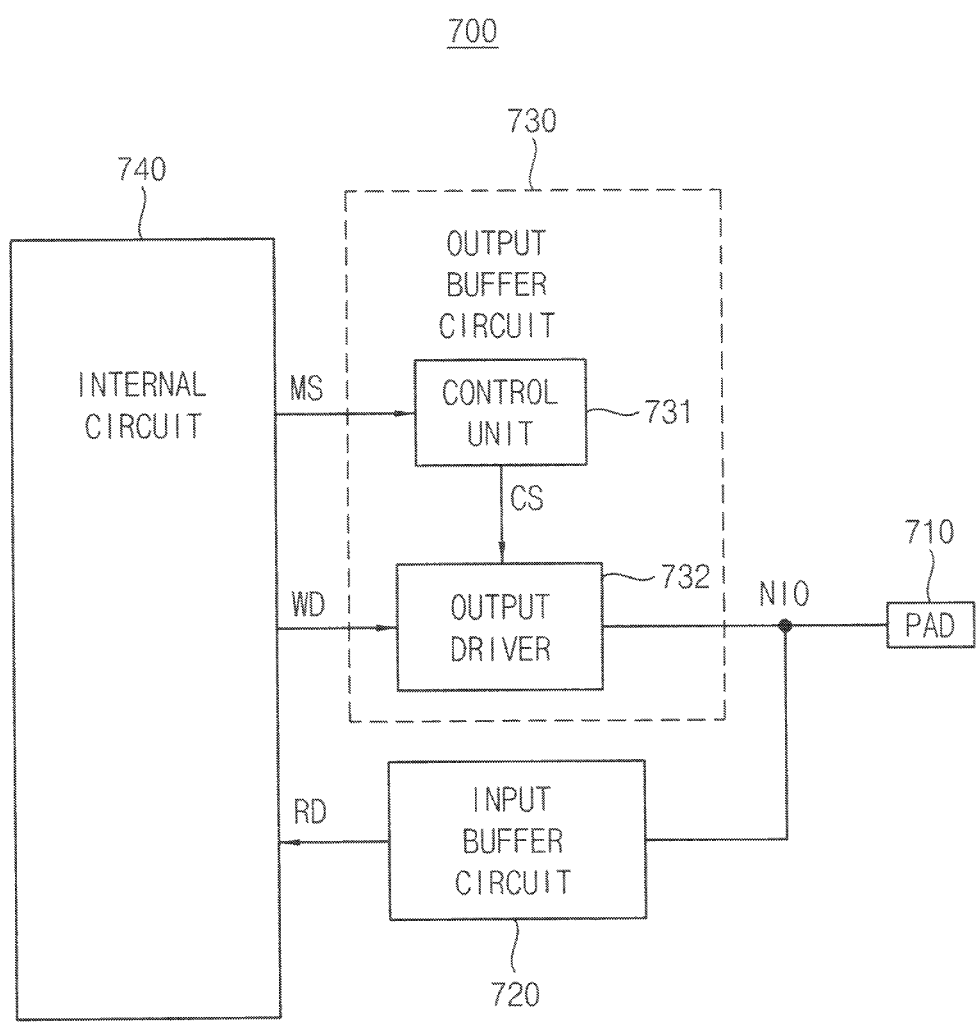
FIG. 9 is a block diagram illustrating an integrated circuit according to some embodiments.

FIG. 9 is a block diagram illustrating an integrated circuit according to some embodiments.

Referring to FIG. 9, an integrated circuit 700 comprises an input/output pad 710, an input buffer circuit 720, an output buffer circuit 730 and an internal circuit 740.

The input/output pad 710 is coupled to an input/output node NIO. Write data WD are output through the input/output pad 710, and read data RD are input through the input/output pad 710. The input buffer circuit 720 is coupled to the input/output node NIO. The input buffer circuit 720 receives the read data RD through the input/output pad 710. The output buffer circuit 730 is coupled to the input/output node NIO. The output buffer circuit 730 may output the write data WD through the input/output pad 710. The internal circuit 740 may generate the write data WD, and process the read data RD received from the input buffer circuit 720. The internal circuit 740 may generate a mode signal MS representing a data output mode or a data input mode.

The output buffer circuit 730 may include a control unit 731 that generates a control signal CS in response to the mode signal MS, and an output driver 732 that selectively performs a driver operation, a termination operation or an ESD protection operation in response to the control signal CS.

As described above, the output buffer circuit 730 may have a driver function, a termination function and/or an ESD protection function since the output driver 732 selectively performs the driver operation, the termination operation or the ESD protection operation.

In some embodiments, the integrated circuit 700 may be a memory device, such as a LPDDR memory device, a LPDDR2 memory device, a mDDR memory device, a DDR memory device, a DDR2 memory device, a DDR3 memory device, a GDDR3 memory, etc., or a controller for controlling the memory device.

As described above, the output buffer circuit and the integrated circuit according to certain embodiments of the inventive concept have a driver function, a termination function and/or an electrostatic discharge protection function, as well as being capable of implementation within a relatively small size. Further, according to some embodiments, an output buffer circuit and an integrated circuit may have various impedances by adjusting the impedance using parallel-connected unit circuits. Further, according to some embodiments, an output buffer circuit and an integrated circuit may be readily applied to various interfaces of a semiconductor device.

The foregoing is illustrative of embodiments and is not to be construed as limiting thereof. Although a few embodiments have been described, those skilled in the art will readily appreciate that many modifications are possible in the embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims.

What is claimed is:

1. A method of operating an output buffer circuit, the method comprising:
   generating a control signal including a switching signal and an operation selection signal in response to a mode signal; and
   selectively performing a driver operation, a termination operation or an electrostatic discharge (ESD) protection operation in response to the control signal, wherein selectively performing the driver operation, the termination operation or the ESD protection operation comprises:
      selectively outputting data or the operation selection signal in response to the switching signal;
      performing the driver operation when the data are output; and
      performing the termination operation or the ESD protection operation when the operation selection signal is output.

2. The method of claim 1, wherein generating the control signal comprises:
   activating the switching signal when the mode signal indicates a data output mode, and
   wherein selectively outputting the data or the operation selection signal comprises:
      outputting the data in response to the activated switching signal.

3. The method of claim 1, wherein generating the control signal comprises:
   deactivating the switching signal when the mode signal indicates a data input mode, and
   wherein selectively outputting the data or the operation selection signal comprises:
      outputting the operation selection signal in response to the deactivated switching signal.

4. The method of claim 3, wherein the operation selection signal includes first and second operation selection signals, and wherein performing the termination operation or the ESD protection operation comprises:
   performing a center termination operation when the first operation signal has a first logic level and the second operation signal has a second logic level;
   performing a pull-up termination operation when the first operation signal has the first logic level and the second operation signal has the first logic level;
   performing a pull-down termination operation when the first operation signal has the second logic level and the second operation signal has the second logic level; and
   performing the ESD protection operation when the first operation signal has the second logic level and the second operation signal has the first logic level.

5. The method of claim 1, wherein a driver impedance of the output buffer circuit is determined by a number of unit circuits performing the driver operation.

6. The method of claim 1, wherein a termination impedance of the output buffer circuit is determined by a number of unit circuits performing the termination operation.

7. The method of claim 1, further comprising:
   adjusting an impedance of each unit circuit included in the output buffer unit based on an impedance of an external resistor.

8. An output buffer circuit, comprising:
   a control unit configured to generate a control signal including a switching signal and an operation selection signal in response to a mode signal; and
   an output driver configured to perform at least one of a driver operation, a termination operation and an electrostatic discharge (ESD) protection operation in response to the control signal, and comprising;
      a switching unit configured to selectively output data or the operation selection signal in response to the switching signal; and
      a unit circuit coupled to the switching unit and configured to perform the driver operation when the switching unit outputs the data, and perform the termination operation or the ESD protection operation in response to the operation selection signal when the switching unit outputs the operation selection signal.

9. The output buffer circuit of claim 8, wherein the control unit receives the mode signal from an internal circuit, and
   wherein the switching unit receives the data from the internal circuit.

10. The output buffer circuit of claim 8, wherein, when the mode signal indicates a data output mode, the control unit activates the switching signal and the switching unit outputs the data to the unit circuit in response to the activated switching signal.

11. The output buffer circuit of claim 8, wherein, when the mode signal indicates a data input mode, the control unit deactivates the switching signal and the switching unit outputs the operation selection signal to the unit circuit in response to the deactivated switching signal.

12. The output buffer circuit of claim 8, wherein the unit circuit performs at least one of a center termination operation, a pull-up termination operation, a pull-down termination operation and the ESD protection operation in response to the operation selection signal.

13. The output buffer circuit of claim 12, wherein the operation selection signal includes first and second operation selection signals, and
   wherein the unit circuit performs the center termination operation when the first operation signal has a first logic level and the second operation signal has a second logic level,
   performs the pull-up termination operation when the first operation signal has the first logic level and the second operation signal has the first logic level,
   performs the pull-down termination operation when the first operation signal has the second logic level and the second operation signal has the second logic level, and performs the ESD protection operation when the first operation signal has the second logic level and the second operation signal has the first logic level.

14. The output buffer circuit of claim 8, further comprising:
a calibration unit coupled to an external resistor, the calibration unit configured to adjust an impedance of the unit circuit based on an impedance of the external resistor.

15. An output buffer circuit, comprising:
a control unit configured to generate a control signal in response to a mode signal; and
an output driver configured to selectively perform a driver operation, a termination operation or an electrostatic discharge (ESD) protection operation in response to the control signal, the output driver comprising:
a plurality of unit circuits connected to each other in parallel, each unit circuit configured to selectively perform the driver operation, the termination operation or the ESD protection operation in response to the control signal.

16. The output buffer circuit of claim 15, wherein the control signal includes a plurality of switching signals and a plurality of operation selection signals,
wherein the output driver further comprises a switching unit configured to selectively output data or the operation selection signals in response to the switching signals, and
wherein the unit circuits selectively perform the driver operation, the termination operation or the ESD protection operation in response to outputs of the switching unit, respectively.

17. The output buffer circuit of claim 15, wherein an impedance of the output driver is adjusted through a number of unit circuits performing the driver operation or the termination operation.

18. The output buffer circuit of claim 15, wherein at least one of the unit circuits performs the driver operation and the other unit circuits perform the ESD protection operation when the output driver performs the driver operation, and
wherein at least one of the unit circuits performs the termination operation and the other unit circuits perform the ESD protection operation when the output driver performs the termination operation.

19. The output buffer circuit of claim 15, wherein the unit circuits are grouped into at least two groups, and wherein the unit circuits in the same group perform the same operation.

20. The output buffer circuit of claim 15, further comprising:
a calibration unit coupled to an external resistor, the calibration unit configured to adjust an impedance of the each unit circuit based on an impedance of the external resistor.

21. An output buffer circuit, comprising:
at least one control unit configured to generate a control signal including a switching signal and an operation selection signal in response to a mode signal; and
a plurality of output drivers configured to selectively perform a driver operation, a termination operation or an electrostatic discharge (ESD) protection operation in response to the control signal, each output driver comprising;
a switching unit configured to selectively output data or the operation selection signal in response to the switching signal; and
a unit circuit coupled to the switching unit and configured to perform the driver operation when the switching unit outputs the data, and perform the termination operation or the ESD protection operation in response to the operation selection signal when the switching unit outputs the operation selection signal.

* * * * *